(12) United States Patent
Pulugurtha et al.

(10) Patent No.: US 11,411,118 B2
(45) Date of Patent: Aug. 9, 2022

(54) INTEGRATED ASSEMBLIES

(71) Applicant: Micron Technology, Inc., Boise, ID (US)

(72) Inventors: Srinivas Pulugurtha, Boise, ID (US); Litao Yang, Boise, ID (US); Haitao Liu, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 17/017,426

(22) Filed: Sep. 10, 2020

(65) Prior Publication Data

US 2022/0077320 A1  Mar. 10, 2022

(51) Int. Cl.
  *H01L 29/786* (2006.01)
  *H01L 27/11514* (2017.01)
  (Continued)

(52) U.S. Cl.
  CPC .. *H01L 29/78642* (2013.01); *H01L 27/10808* (2013.01); *H01L 27/11514* (2013.01);
  (Continued)

(58) Field of Classification Search
  CPC .................. H01L 29/66409; H01L 27/10864
  See application file for complete search history.

(56) References Cited

U.S. PATENT DOCUMENTS

| 10,297,611 | B1 | 5/2019 | Wells et al. | |
|---|---|---|---|---|
| 2007/0122986 | A1* | 5/2007 | Sandhu | B82Y 10/00 438/301 |

(Continued)

FOREIGN PATENT DOCUMENTS

| WO | WO 2019/133277 | 7/2019 |
|---|---|---|
| WO | WO PCT/US2021/046555 | 12/2021 |

OTHER PUBLICATIONS

Lee et al., "H2 High Pressure Annealed Y-Doped ZrO2 Gate Dielectric with an EOT of 0.57 nm for Ge MOSFETs", IEEE Electron Device Letters vol. 40, No. 9, United States, Sep. 2019, pp. 1350-1353.
Sugimoto et al., "Effective Work Function Modulation of TaN Metal Gate on HfO2 after Postmetallization Annealing", Applied Physics Letters 91, 2007, United States, 3 pages.
Yang et al., "High-Performance 1-V ZnO Thin-Film Transistors with Ultrathin, ALD-Processed ZrO2 Gate Dielectric", IEEE Transactions on Electron Devices vol. 66, No. 8, Aug. 2019, United States, pp. 3382-3386.

*Primary Examiner* — Mohammad M Choudhry
(74) *Attorney, Agent, or Firm* — Wells St. John P.S.

(57) ABSTRACT

Some embodiments include integrated memory. The integrated memory includes a first series of first conductive structures and a second series of conductive structures. The first conductive structures extend along a first direction. The second conductive structures extend along a second direction which crosses the first direction. Pillars of semiconductor material extend upwardly from the first conductive structures. Each of the pillars includes a lower source/drain region, an upper source/drain region, and a channel region between the lower and upper source/drain regions. The lower source/drain regions are coupled with the first conductive structures. Insulative material is adjacent sidewall surfaces of the pillars. The insulative material includes $ZrO_x$, where x is a number greater than 0. The second conductive structures include gating regions which are spaced from the channel regions by at least the insulative material. Storage elements are coupled with the upper source/drain regions.

32 Claims, 5 Drawing Sheets

(51) Int. Cl.
H01L 29/49 (2006.01)
H01L 27/108 (2006.01)
H01L 29/51 (2006.01)

(52) U.S. Cl.
CPC ........ H01L 29/4966 (2013.01); H01L 29/517 (2013.01); H01L 29/7869 (2013.01)

(56) References Cited

U.S. PATENT DOCUMENTS

| | | | |
|---|---|---|---|
| 2008/0308855 A1* | 12/2008 | El-Kareh | H01L 27/115 257/314 |
| 2012/0061751 A1 | 3/2012 | Gibbons et al. | |
| 2013/0062602 A1* | 3/2013 | Jeon | H01L 29/7869 257/43 |
| 2014/0167131 A1* | 6/2014 | Lu | H01L 29/792 257/316 |
| 2018/0197862 A1 | 7/2018 | Sills et al. | |
| 2018/0226411 A1* | 8/2018 | Jung | C01G 23/0536 |
| 2019/0131435 A1* | 5/2019 | Yamashita | H01L 29/7827 |

* cited by examiner

INTEGRATED ASSEMBLIES

TECHNICAL FIELD

Integrated assemblies (e.g., integrated memory, integrated transistors, etc.).

BACKGROUND

Memory may utilize memory cells which individually comprise an access device (e.g., an access transistor) in combination with a storage element (e.g., a capacitor, a resistive memory device, a phase change memory device, etc.).

The transistors may be field effect transistors (FETs). The FETs may each include a channel region between a pair of source/drain regions, and may each include one or more gates configured to electrically connect the source/drain regions to one another through the channel region. The transistors may be vertical FETs (VFETs), with VFETs being transistors which have channel regions that are generally perpendicular to a primary surface of a substrate on which the transistors are formed.

It would be desirable to develop improved transistors. It would also be desirable to develop improved memory architecture.

BRIEF DESCRIPTION OF THE DRAWINGS

FIG. 1A-1 is a diagrammatic cross-sectional side view of an example region alternative to that of FIG. 1A.

DETAILED DESCRIPTION OF THE ILLUSTRATED EMBODIMENTS

Some embodiments include transistors having active regions which include source/drain regions and channel regions. Insulative material extends along at least the channel regions, and the insulative material may include ZrO (where the chemical formula indicates primary constituents rather than a specific stoichiometry). Conductive gating material is adjacent the insulative material, and is spaced from the channel region by at least the insulative material. The conductive gating material may include ruthenium.

The transistors may be utilized in any suitable applications, and in some embodiments may be incorporated into integrated memory.

Example embodiments are described with reference to FIGS. 1-6.

Figure 1:
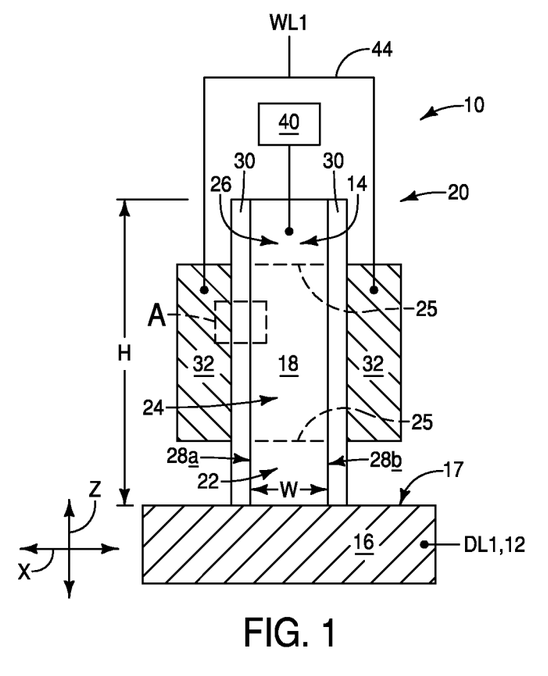
FIG. 1 is a diagrammatic cross-sectional side view of an example region of an example integrated assembly.

Referring to FIG. 1, an integrated assembly 10 includes a pillar 14 which extends upwardly from a conductive structure (e.g., conductive line) 12. The conductive structure 12 comprises conductive material 16. The conductive material 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The pillar 14 comprises semiconductor material 18, and may be considered to be configured as a vertically-extending active region of a transistor (access device, VFET) 20. The semiconductor material 18 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 18 may comprise, consist essentially of, or consist of at least one metal (e.g., one or more of aluminum, gallium, indium, thallium, tin, cadmium, zinc, etc.) in combination with one or more of oxygen, sulfur, selenium and tellurium. In some embodiments, the semiconductor material 18 may comprise at least one element from Group 13 of the periodic table (e.g., gallium) in combination with at least one element from Group 16 of the periodic table (e.g., oxygen). For instance, the semiconductor material 18 may comprise at least one element selected from the group consisting of gallium, indium and mixtures thereof, in combination with at least one element selected from the group consisting of oxygen, sulfur, selenium, tellurium and mixtures thereof. In some embodiments, the semiconductor material 18 may comprise, consist essentially of, or consist of a semiconductor oxide (i.e., a semiconductor material comprising oxygen). For instance, in some embodiments the semiconductor material 18 may comprise, consist essentially of, or consist of InGaZnO (where the chemical formula indicates primary constituents rather than a specific stoichiometry). In some embodiments, semiconductor oxide material may be referred to as oxide semiconductor material.

The semiconductor material 18 may be homogeneous or may comprise two or more different compositions. In some embodiments, a lower region of the semiconductor material 18 may be configured as a lower source/drain region 22, an upper region of the semiconductor material 18 may be configured as an upper source/drain region 26, and a central region of the semiconductor material 18 (i.e., a region between the upper and lower source/drain regions) may be configured as a channel region 24. The source/drain regions may comprise different compositions than the channel region and/or may comprise different dopant(s) than the channel region. Dashed lines 25 are provided to show approximate boundaries between the source/drain regions and the channel region.

The conductive structure 12 extends along an illustrated x-axis direction (which may also be referred to as a first direction), and comprises a horizontally-extending upper surface 17. The pillar 14 extends vertically along an illustrated z-axis direction, and accordingly extends orthogonally (or at least substantially orthogonally) relative to the horizontally-extending upper surface 17. The term "substantially orthogonally" means orthogonally to within reasonable tolerances of fabrication and measurement. The pillar 14 may be considered to extend vertically, or at least substantially vertically. In some embodiments, the pillar 14 may extend at an angle of about 90° (±10°) relative to the horizontally-extending surface 17.

The pillar 14 may comprise any suitable dimensions. In some embodiments, the pillar may comprise a height, H, within a range of from about 10 nanometers (nm) to about 1000 nm, within a range of from about 10 nm to about 500 nm, within a range of from about 10 nm to about 100 nm, etc.; and may comprise a width, W, within a range of from about 2 nm to about 200 nm, within a range of from about 2 nm to about 100 nm, within a range of from about 2 nm to about 50 nm, etc.

The conductive structure 12 may be supported by a semiconductor-containing base (not shown) of a semiconductor-containing die. The base may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The pillar 14 comprises a pair of sidewalls surfaces 28a and 28b along the cross-section of FIG. 1, with such sidewall surfaces being disposed in opposing relation relative to one another.

Insulative material 30 is along the sidewall surfaces 28a and 28b. In some embodiments, at least a portion of the insulative material 30 comprises ZrO, where the chemical formula indicates primary constituents rather than a specific stoichiometry. The ZrO may be referred to as zirconium oxide. The zirconium oxide have any suitable composition, and in some embodiments may correspond to $ZrO_2$. The insulative material 30 may comprise any suitable thickness, and in some embodiments may comprise a thickness within a range of from about 1 nm to about 10 nm.

In some embodiments, the insulative material 30 may comprise, consist essentially of, or consist of ZrO (where the chemical formula indicates primary constituents rather than a specific stoichiometry). In some embodiments, the insulative may comprise dopant in addition to the ZrO. The dopant may comprise one or more elements selected from Group 3 of the periodic table, with Group 3 being understood to include scandium (Sc), yttrium (Y), the lanthanide elements and the actinide elements. The dopant may be provided to a total concentration within a range of from about 0.5 atomic percent (at %) to about 0.05 at %. For instance, in some embodiments the material 30 may be doped with yttrium such that the yttrium is present to a concentration within a range of from about 0.5 at % to about 0.05 at %.

Conductive gating material 32 is adjacent the insulative 30, and is spaced from the semiconductor material 18 of the pillar 14 by at least the insulative material 30. In the shown embodiment, conductive gating material 32 is directly against the insulative material 30.

The conductive gating material 32 is proximate the channel region 24. In some embodiments, the gating material 32 may be considered to be "operatively proximate" the channel region 24 such that a sufficient voltage applied to the gating material 32 will induce an electric field within the channel region 24 which enables current flow through the channel region to electrically couple the source/drain regions 22 and 26 with one another. If the voltage to the gating material 32 is below a threshold level, the current will not flow through the channel region 24, and the source/drain regions 22 and 26 will not be electrically coupled with one another. The selective control of the coupling/decoupling of the source/drain regions through the level of voltage applied to the gating material 32 may be referred to as gated coupling of the source/drain regions.

The gating material 32 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the gating material 32 may comprise, consist essentially of, or consist of one or more of Ru, TiN and TaN, where the chemical formulas indicate primary constituents rather than a specific stoichiometry.

In the shown embodiment, the insulative material 30 extends along the entirety of the sidewalls 28a and 28b of the pillar 14, and accordingly extends along the source/drain regions 22 and 26, as well as along the channel region 24. In other embodiments, the insulative material 30 may not be provided along at least a portion of one or both of the source/drain regions 22 and 26.

Problems associated with conventional transistors utilizing semiconductor oxide (e.g., InGaZnO) may include low threshold voltage ($V_T$) and high time-dependent dielectric breakdown (TDDB). The low $V_T$ can make it difficult to operate the transistors within conventional voltage regimes associated with conventional memory architectures. The high TDDB can lead to reduced lifetime of the devices, and can render the devices particularly susceptible to stresses associated with some of the operational modes of conventional memory, such as, for example, row-hammer stresses.

The utilization of ZrO (where the chemical formula indicates primary constituents rather than a specific stoichiometry) within the insulative material 30 may improve the overall workfunction of metal of the conductive gating material 32 relative to the semiconductor material 18, which may improve $V_T$. Also, the TDDB may be improved through the utilization of the ZrO in combination with AlO (where the chemical formulas indicate primary constituents rather than specific stoichiometries) within the insulative material 30. The incorporation of yttrium (and/or other elements from Group 3 of the periodic table) may further improve one or both of the $V_T$ and the TDDB. The utilization of ruthenium within the conductive gating material 32 may further improve the workfunction, and may lead to improvement in $V_T$. Also, utilization of one or both of TiN and TaN within the conductive gating material 32 may improve the workfunction. Further, utilization of zirconium oxide within the insulative material 30 may improve leakage characteristics (i.e., may reduce undesired leakage) of the insulative material as compared to conventional configurations lacking the zirconium oxide, and may improve a sub-threshold slope of the access device 20.

The insulative material 30 of FIG. 1 may include one or more of SiO, AlO, InO, SiON, HfO and TaO, in addition to the ZrO, where the chemical formulas indicate primary constituents rather than specific stoichiometries. The insulative material may be homogeneous, as shown in FIG. 1, or may comprise two or more layers of different compositions relative to one another.

Figure 1A:
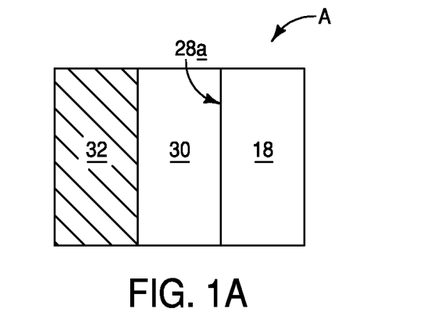
FIG. 1A is an enlarged diagrammatic cross-sectional side view of an example region "A" of FIG. 1.
Figure 1A:
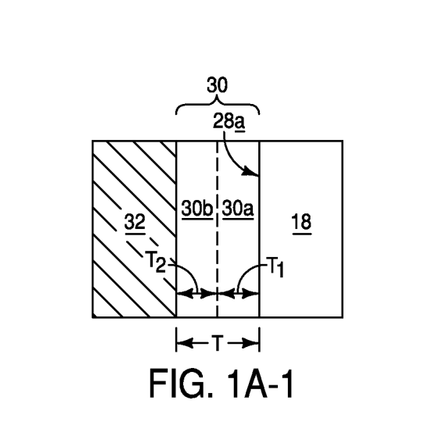

FIG. 1A shows an enlarged view of a region "A" of FIG. 1, and shows an embodiment in which the insulative material 30 is homogeneous. FIG. 1A-1 shows an embodiment analogous to that of FIG. 1A, but shows the insulative material 30 as a heterogeneous combination of two layers 30a and 30b. In some embodiments, one of the layers 30a and 30b may be a first layer which comprises, consists essentially of, or consists of ZrO (where the chemical formula indicates primary constituents rather than a specific stoichiometry), and the other of the layers 30a and 30b may be a second layer which comprises, consists essentially of, or consists of one or more of SiO, AlO, InO, SiON, HfO and TaO (where the chemical formulas indicate primary constituents rather than specific stoichiometries). The first layer (i.e., the layer comprising ZrO) may be directly against the sidewall surface 28a of the semiconductor material 18 in some embodiments, and in other embodiments the second layer (i.e., the layer comprising one or more of SiO, AlO, InO, SiON, HfO and TaO) may be directly against the sidewall surface 28a of the semiconductor material 18. Yttrium (and/or other elements from Group 3 of the periodic table) may be provided within one or both of the layers 30a and 30b to a desired concentration (e.g., to a concentration within a range of from about 0.5 at % to about 0.05 at %).

The insulative material 30 of FIG. 1A-1 has an overall thickness T, and the layers 30a and 30b have thicknesses $T_1$ and $T_2$, respectively. The thickness T may be within a range of from about 1 nm to about 10 nm. The thicknesses $T_1$ and $T_2$ may be about the same as one another, as shown; or may be different relative to one another. In some embodiments, the thicknesses $T_1$ and $T_2$ may each comprise a percentage of the overall thickness T which is within a range of from about 5% to about 95%.

The interface between the layers 30a and 30b may be an abrupt interface, or may be a gradient.

The embodiment of FIG. 1A-1 shows the insulative material 30 comprising two layers 30a and 30b. In other embodiments, the insulative material may comprise more than two layers.

Figure 1B:
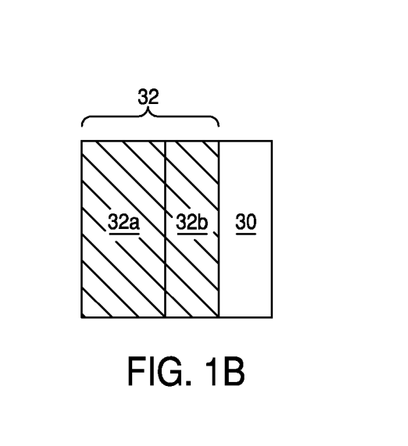
FIG. 1B is a diagrammatic cross-sectional side view of an example region of an example assembly.

The conductive gating material 32 of FIG. 1 may comprise a homogeneous composition (as shown in FIG. 1), or may comprise a heterogeneous combination of two or more layers. FIG. 1B shows a portion of an assembly analogous to the assembly of FIG. 1, but in which the conductive gating material 32 comprises a heterogeneous combination of two layers 32a and 32b, with such two layers being laterally adjacent to another. In some embodiments, one of the layers 32a and 32b comprises, consists essentially of, or consists of Ru; and the other of the layers 32a and 32b comprises, consists essentially of, or consists of one or both of TiN and TaN (where the chemical formulas indicate primary constituents rather than specific stoichiometries). The layer comprising Ru may or may not be the layer which is directly adjacent the material 30. Although the conductive gating material 32 is shown comprising two layers 32a and 32b, it is to be understood that in other embodiments the conductive gating material may comprise more than two layers.

Referring again to FIG. 1, the transistor 20 is shown to be provided between the conductive structure 12 and a storage element 40. The lower source/drain regions 22 is electrically coupled with the conductive structure 12, and the upper source/drain region 26 is electrically coupled with the storage element 40. In operation, the transistor 20 may be utilized as an access device between the conductive structure 12 and the storage element 40. The conductive structure 12 may correspond to a digit line (sense line, bitline) extending along the plane of the cross-section of FIG. 1, and the conductive gating material 32 may be part of a wordline (access line) 44 extending in and out of the plane of the cross-section of FIG. 1. The digit line 12 is also labeled as DL1, and the wordline 44 is also labeled as WL1.

The storage-element 40 may be any suitable device having at least two detectable states; and in some embodiments may be, for example, a capacitor, a resistive-memory device, a conductive-bridging device, a phase-change-memory (PCM) device, a programmable metallization cell (PMC), etc. If the storage element is a capacitor, it may be either a ferroelectric capacitor (i.e., may comprise ferroelectric insulative material between a pair of capacitor electrodes) or may be a non-ferroelectric capacitor (i.e., may comprise only non-ferroelectric insulative material between a pair of capacitor electrodes). Example ferroelectric insulative material may include one or more of transition metal oxide, zirconium, zirconium oxide, niobium, niobium oxide, hafnium, hafnium oxide, lead zirconium titanate, and barium strontium titanate. Example non-ferroelectric insulative material may comprise, consist essentially of, or consist of silicon dioxide.

Figure 2:
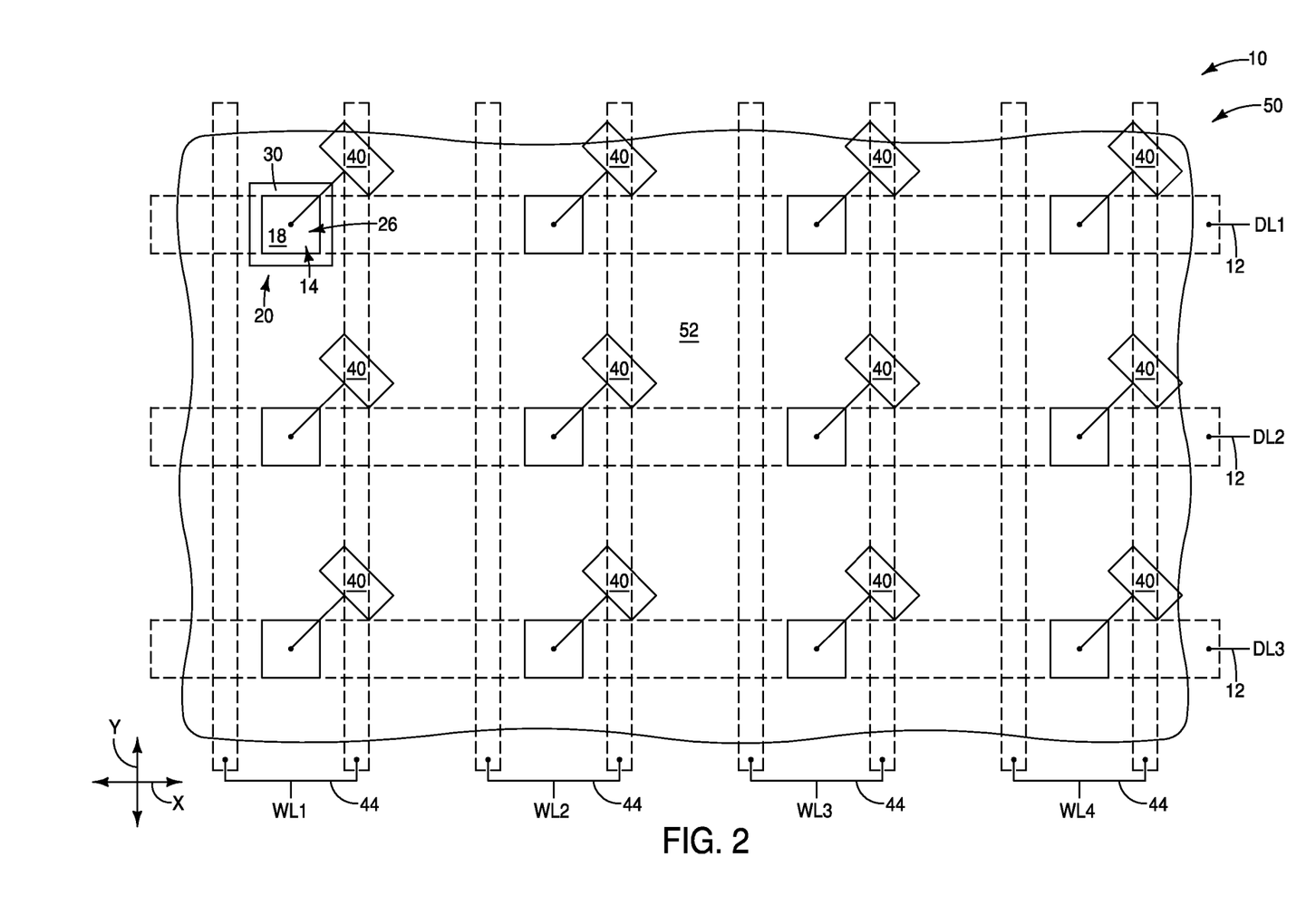
FIG. 2 is a diagrammatic top-down view of a region of an example integrated assembly.

The storage element 40 and access device 20 of FIG. 1 may be incorporated into a memory array. FIG. 2 shows a view of a region of an integrated assembly 10 comprising an example memory array 50. The conductive lines 12 and 44 are shown in dashed-line view to indicate that they are beneath other materials. Specifically, an insulative material 52 is shown to be over the conductive lines 12 and 44. The insulative material 52 may comprise any suitable composition(s), and in some embodiments may comprise, consist essentially of, or consist of silicon dioxide.

Digit lines DL1-DL3 extend along a first direction corresponding to an illustrated x-axis direction, and wordlines WL1-WL4 extend along a second direction corresponding to an illustrated y-axis direction. The second direction of the wordlines crosses the first direction of the digit lines. In the shown embodiment, the second direction of the wordlines is orthogonal to (or at least substantially orthogonal to) the first direction of the digit lines, with the term "substantially orthogonal" meaning orthogonal to within reasonable tolerances of fabrication and measurement. In other embodiments, the wordlines may cross the digit lines at other angles.

In some embodiments, the digit lines 12 may be considered to correspond to a first set of conductive structures which extend along a first direction (the x-axis direction), and the wordlines 44 may be considered to be a second set of conductive structures which extend along a second direction (the y-axis direction). The second conductive structures 44 include the gating regions 32 described above with reference to FIG. 1.

The wordlines (e.g., WL1) and the digit lines (e.g., DL1) are shown to be substantially straight. In other embodiments, the wordlines and/or the digit lines may be curved, wavy, etc.

Figure 3:
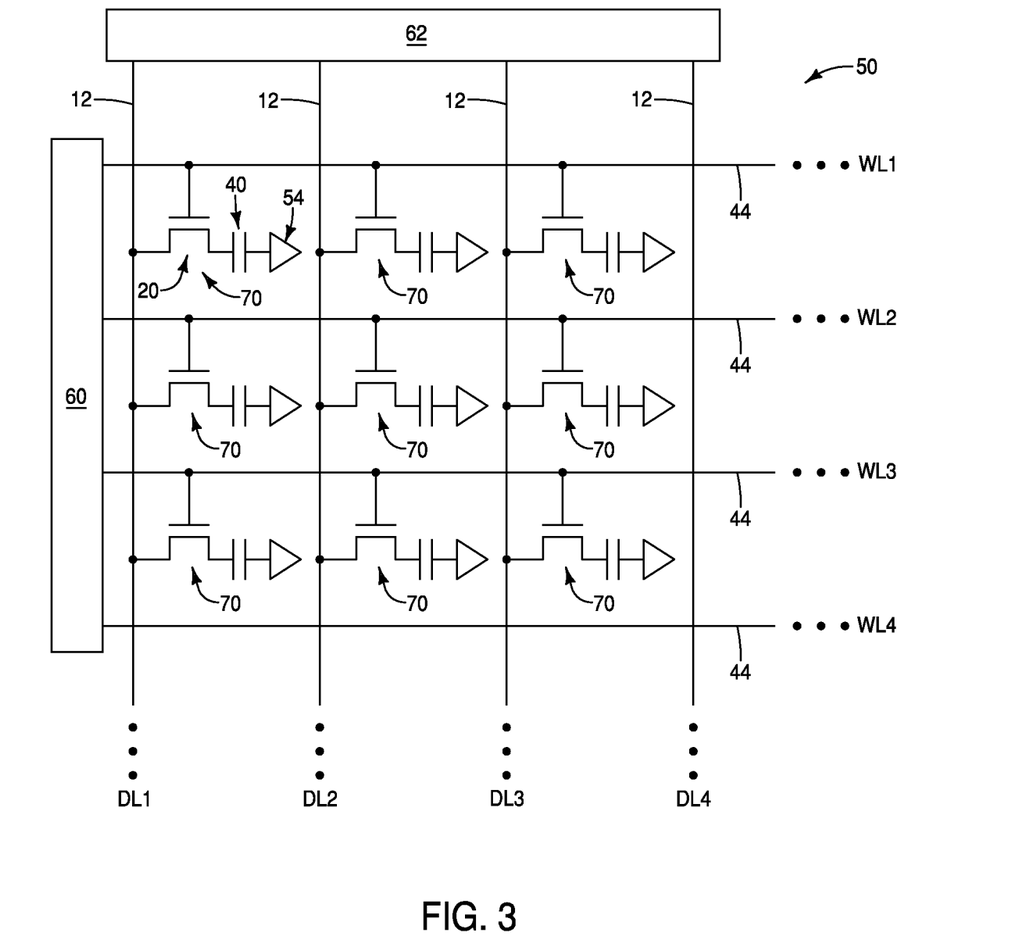
FIG. 3 is a diagrammatic schematic view of a region of an example memory array.

The memory array 50 may have any suitable configuration. FIG. 3 shows an example configuration in which the storage elements 40 are capacitors. The capacitors may be non-ferroelectric capacitors, and accordingly the memory array 50 may be a dynamic random access memory (DRAM) array. Alternatively, the capacitors may be ferroelectric capacitors, and accordingly the memory array 50 may be a ferroelectric random access memory (FeRAM) array.

The illustrated capacitors 40 each have an electrical node coupled with an access transistor 20, and have another electrical node coupled with a reference 54. The reference 54 may correspond to any suitable reference voltage, including, ground, VCC/2, etc.

The wordlines 44 are shown coupled with wordline-driver-circuitry 60, and the digit lines 12 are shown coupled with sense-amplifier-circuitry 62. The access transistors 20 and storage elements 40 together form memory cells 70, with each of the memory cells being uniquely addressed by one of the digit lines 12 in combination with one of the wordlines 44.

Figure 4:
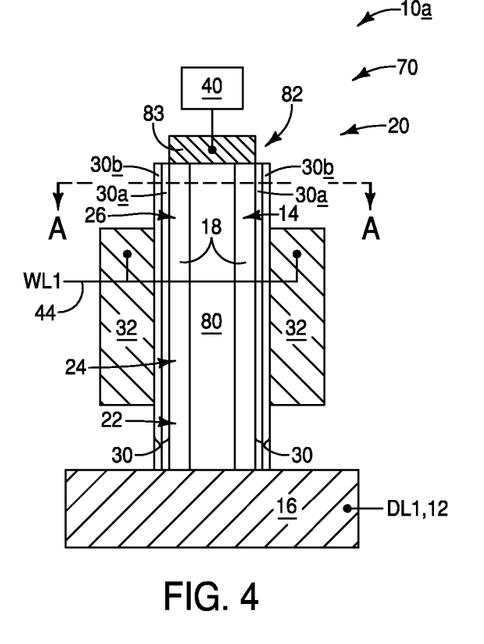
FIGS. 4-6 are diagrammatic cross-sectional side views of example regions of example integrated assemblies.
Figure 5:
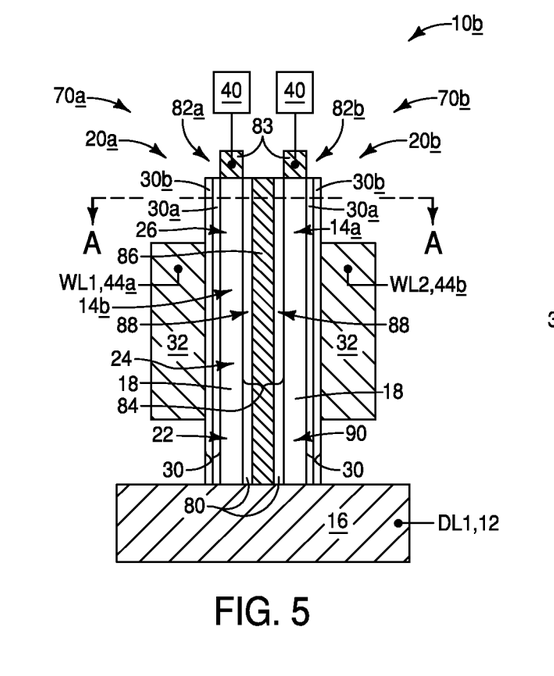
Figure 6:
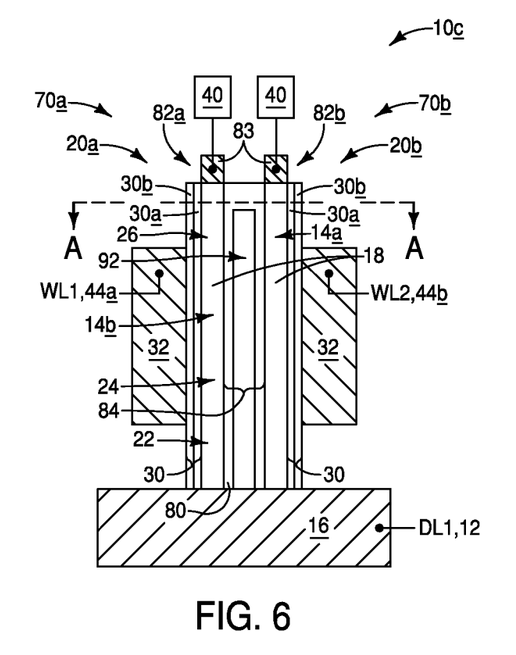

FIGS. 4-6 show additional example structures of example embodiments.

FIG. 4 shows an integrated assembly 10a having the semiconductor material 18 laterally surrounding an insulative material 80. The insulative material 80 may comprise any suitable composition(s), including, for example, one or more of $Y_2O_3$, $SiO_2$, etc. In some embodiments, at least some of the insulative material 80 may be replaced with an air gap. The pillar 14 may be considered to include the semiconductor material 18 configured as a shell, with such shell laterally surrounding the insulative material 80 (and/or an airgap).

The storage element 40 is shown to be coupled with an upper portion of the pillar 14 (i.e., to be coupled with the upper source/drain region 26) through an electrically conductive interconnect 82. Such interconnect comprises electrically conductive material 83. The material 83 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive gating material 32 may comprise any of the compositions described above, and in some embodiments may comprise one or more of TiN, TaN and Ru, where the chemical formulas indicate primary constituents rather than specific stoichiometries.

The dielectric material 30 is shown to comprise the two compositions 30a and 30b described above with reference to FIG. 1A-1 (e.g., $Al_2O_3$ and $ZrO_2$).

Figure 4A:
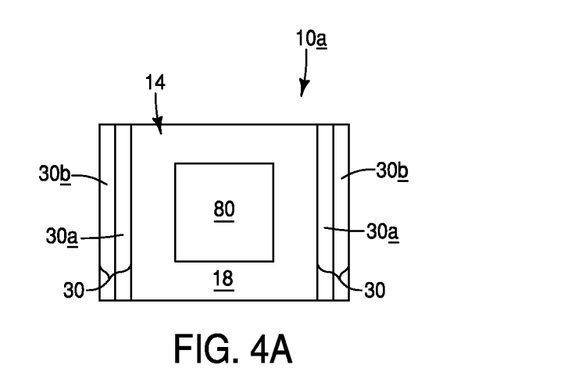
FIGS. 4A, 5A and 6A are diagrammatic top-down sectional views along the lines A-A of FIGS. 4-6, respectively.

The cross-section of FIG. 4A shows the semiconductor material 18 encapsulating an outer lateral periphery of the insulative material 80.

FIG. 5 shows an integrated assembly 10b having the semiconductor material 18 on opposing sides of a central column 84. The column 84 comprise a conductive material 86 between a pair of insulative panels 88 which comprise the insulative material 80. A post 90 comprises the column 84, and a pair of the pillars 14 of the semiconductor material 18. The pillars 14 of said pair are labeled as 14a and 14b so that they may distinguished from one another. The post 90 may be referred to as "common post" in that it is common to the pillars 14a and 14b (i.e., it includes both of the pillars 14a and 14b). The pillar 14a is within a first transistor 20a which is within a first memory cell 70a, and the pillar 14b is within a second transistor 20b which is within a second memory cell 70b. The interconnects within the first and second memory cells 70a and 70b are labeled as 82a and 82b.

Figure 5A:
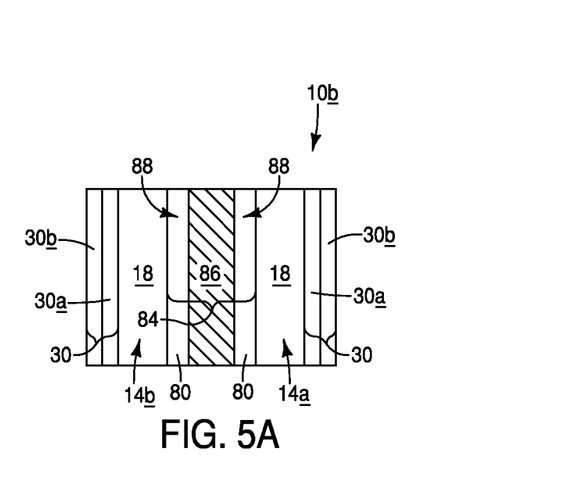

The cross-section of FIG. 5A shows the semiconductor material 18 being on opposing sides of the column 84.

Figure 6A:
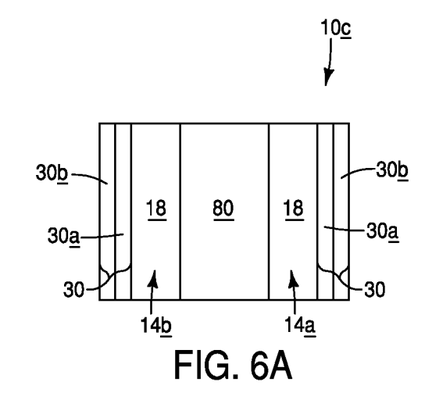

FIGS. 6 and 6A show an integrated assembly 10c similar to the assembly 10b of FIGS. 5 and 5A, except that the column 84 comprises the insulative material 80 around an air gap 92.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a transistor. The transistor has an active region containing semiconductor material, has an insulative material adjacent the active region, and has a conductive gating material spaced from the active region by at least the insulative material. The conductive gating material is operatively proximate the active region. The insulative material includes ZrO, where the chemical formula indicates primary constituents rather than a specific stoichiometry.

Some embodiments include an integrated assembly having a conductive structure, and having a pillar of semiconductor material extending upwardly from the conductive structure. The pillar has a pair of opposing sidewall surfaces along a cross-section. The pillar includes a lower source/drain region, an upper source/drain region, and a channel region between the lower and upper source/drain regions. Insulative material is adjacent the sidewall surfaces. The insulative material comprises ZrO, where the chemical formula indicates primary constituents rather than a specific stoichiometry. Conductive gating material is operatively proximate the channel region and is spaced from the channel region by at least the insulative material.

Some embodiments include integrated memory. The integrated memory includes a first series of first conductive structures and a second series of second conductive structures. The first conductive structures extend along a first direction. The second conductive structures extend along a second direction which crosses the first direction. Pillars of semiconductor material extend upwardly from the first conductive structures. Each of the pillars includes a lower source/drain region, an upper source/drain region, and a channel region between the lower and upper source/drain regions. The lower source/drain regions are coupled with the first conductive structures. Insulative material is adjacent sidewall surfaces of the pillars. The insulative material includes ZrO, where the chemical formula indicates primary constituents rather than a specific stoichiometry. The second conductive structures include gating regions operatively proximate the channel regions and spaced from the channel regions by at least the insulative material. Storage elements are coupled with the upper source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A transistor, comprising:
   an active region comprising a post structure comprising semiconductor material, the post structure having opposing sidewalls extending along an entirety of a height of the post structure and including a channel region between a first source/drain region and a second source/drain region, an entirety of each of the first source/drain region and the second source/drain region being within the post structure;
   an insulative material adjacent the active region and extending along an entirety of the opposing sidewalls, the insulative material comprising ZrO where the chemical formula indicates primary constituents rather than a specific stoichiometry; and
   a conductive gating material spaced from the active region by at least the insulative material and being operatively proximate the active region.

2. The transistor of claim 1 comprising one or more elements from Group 3 of the periodic table within the ZrO, with Group 3 being understood to include the lanthanide elements and the actinide elements in addition to Sc and Y.

3. The transistor of claim 1 comprising yttrium within the ZrO.

4. The transistor of claim 3 wherein the yttrium is present to a concentration within a range of from about 0.5 at % to about 0.05 at %.

5. The transistor of claim 1 wherein the semiconductor material comprises at least one element selected from Group 13 of the periodic table in combination with at least one element selected from Group 16 of the periodic table.

6. The transistor of claim 1 wherein the semiconductor material comprises oxide semiconductor material.

7. The transistor of claim 1 wherein the semiconductor material comprises InGaZnO, where the chemical formula indicates primary constituents rather than a specific stoichiometry.

8. The transistor of claim 1 wherein the conductive gating material includes one or more of TiN, Ru and TaN, where the chemical formulas indicate primary constituents rather than a specific stoichiometry.

9. The transistor of claim 1 wherein the conductive gating material includes ruthenium.

10. The transistor of claim 1 wherein the conductive gating material consists of ruthenium.

11. The transistor of claim 1 wherein the conductive gating material is operatively proximate the channel region.

12. The transistor of claim 11 wherein the semiconductor material is within the channel region, and is also within the source/drain regions.

13. The transistor of claim 11 wherein the semiconductor material is within the channel region, and wherein a material different from the semiconductor material is within one or both of the source/drain regions.

14. The transistor of claim 1 wherein the insulative material has a thickness within a range of from about 1 nm to about 10 nm.

15. The transistor of claim 1 wherein the insulative material is a first insulative material and wherein the semiconductor material laterally surrounds a second insulative material within the post structure.

16. The transistor of claim 1 wherein the semiconductor material laterally surrounds a void.

17. The transistor of claim 1 wherein the semiconductor material is one of two pillars, wherein the post structure is a common post comprising the two pillars, and wherein a conductive column is between said two pillars.

18. The transistor of claim 1 wherein the semiconductor material is one of two pillars, wherein the post structure is a common post comprising the two pillars, and wherein a void is between said two pillars.

19. An integrated assembly, comprising:
   a conductive structure;
   a pillar of semiconductor material extending upwardly from the conductive structure; the pillar having a pair of opposing sidewall surfaces along a cross-section, the sidewall surfaces extending along an entirety of a height of the pillar; the pillar including a lower source/drain region, an upper source/drain region, and a channel region between the lower and upper source/drain regions;
   an insulative material adjacent an entirety of the opposing sidewall surfaces, the insulative material comprising ZrO where the chemical formula indicates primary constituents rather than a specific stoichiometry; and
   a conductive gating material operatively proximate the channel region and spaced from the channel region by at least the insulative material.

20. The integrated assembly of claim 19 wherein the semiconductor material comprises at least one element selected from Group 13 of the periodic table in combination with at least one element selected from Group 16 of the periodic table.

21. The integrated assembly of claim 19 wherein the semiconductor material comprises InGaZnO, where the chemical formula indicates primary constituents rather than a specific stoichiometry.

22. The integrated assembly of claim 19 comprising a storage element coupled with the upper source/drain region; and wherein the lower source/drain region is coupled with the conductive structure.

23. The integrated assembly of claim 19 wherein the insulative material includes one or more of SiO, AlO, InO, SiON, HfO and TaO in addition to the ZrO, where the chemical formulas indicate primary constituents rather than a specific stoichiometry.

24. The integrated assembly of claim 19 wherein the insulative material includes AlO in addition to the ZrO, where the chemical formulas indicate primary constituents rather than a specific stoichiometry.

25. The integrated assembly of claim 24 wherein the insulative material comprises a first layer adjacent a second layer, with the first layer comprising the AlO and the second layer comprising the ZrO.

26. The integrated assembly of claim 25 comprising yttrium throughout the first and second layers.

27. The integrated assembly of claim 26 wherein the yttrium is present to a concentration within a range of from about 0.5 at % to about 0.05 at %.

28. The integrated assembly of claim 25 wherein the first layer is directly against the semiconductor material.

29. The integrated assembly of claim 25 wherein the second layer is directly against the semiconductor material.

30. The integrated assembly of claim 25 wherein the insulative material has an overall thickness, and wherein the first layer has a first thickness which comprises a percentage of the overall thickness, with such percentage being within a range of from about 5% to about 95%.

31. The integrated assembly of claim 25 comprising an abrupt interface between the first and second layers.

32. The integrated assembly of claim 25 comprising a gradient between the first and second layers.

* * * * *